(12) United States Patent
Asadi et al.

(10) Patent No.: US 11,249,841 B2
(45) Date of Patent: Feb. 15, 2022

(54) PREVENTING READ DISTURBANCE ACCUMULATION IN A CACHE MEMORY

(71) Applicants: Hossein Asadi, Tehran (IR); Elham Cheshmikhanikhanghah, Tehran (IR); Hamed Farbeh, Tehran (IR)

(72) Inventors: Hossein Asadi, Tehran (IR); Elham Cheshmikhanikhanghah, Tehran (IR); Hamed Farbeh, Tehran (IR)

(73) Assignees: HIGH PERFORMANCE DATA STORAGE, Tehran (IR); SHARIF UNIVERSITY OF TECHNOLOGY, Tehran (IR)

(*) Notice: Subject to any disclaimer, the term of this patent is extended or adjusted under 35 U.S.C. 154(b) by 0 days.

(21) Appl. No.: 16/798,451

(22) Filed: Feb. 24, 2020

(65) Prior Publication Data

US 2020/0192752 A1    Jun. 18, 2020

Related U.S. Application Data

(60) Provisional application No. 62/809,644, filed on Feb. 24, 2019.

(51) Int. Cl.
| | |
|---|---|
| *G11C 29/00* | (2006.01) |
| *G06F 11/10* | (2006.01) |
| *G11C 29/52* | (2006.01) |
| *G11C 11/16* | (2006.01) |
| *G06F 11/16* | (2006.01) |

(52) U.S. Cl.
CPC ...... *G06F 11/1048* (2013.01); *G06F 11/1064* (2013.01); *G06F 11/1641* (2013.01); *G11C 11/16* (2013.01); *G11C 29/52* (2013.01)

(58) Field of Classification Search
CPC ............ G06F 11/1048; G06F 11/1064; G06F 11/1641; G11C 29/52; G11C 11/16
See application file for complete search history.

(56) References Cited

U.S. PATENT DOCUMENTS

| | | | | |
|---|---|---|---|---|
| 7,437,597 | B1* | 10/2008 | Kruckemyer | G06F 11/1064 714/6.11 |
| 2004/0199851 | A1* | 10/2004 | Quach | G06F 11/1064 714/758 |
| 2007/0226425 | A1* | 9/2007 | Caprioli | G06F 12/0804 711/143 |
| 2014/0344641 | A1* | 11/2014 | Jeong | G06F 12/0864 714/759 |
| 2017/0206165 | A1* | 7/2017 | Lim | G11C 11/408 |

* cited by examiner

*Primary Examiner* — Samir W Rizk
(74) *Attorney, Agent, or Firm* — Bajwa IP Law Firm; Haris Zaheer Bajwa

(57) ABSTRACT

A method for preventing read disturbance accumulation in a cache memory. The method includes accessing a plurality of data lines in a cache set, generating a plurality of corrected data from a plurality of initial data based on a plurality of error correction codes (ECCs), and selecting a respective corrected data of the plurality of corrected data based on a respective way of a plurality of ways. Each of the plurality of data lines includes a respective data field of a plurality of data fields and a respective ECC field of a plurality of ECC fields. The plurality of initial data are stored in the plurality of data fields and the plurality of ECCs are stored in the plurality of ECC fields. Each of the plurality of ways is associated with a respective data line of the plurality of data lines.

18 Claims, 13 Drawing Sheets

PREVENTING READ DISTURBANCE ACCUMULATION IN A CACHE MEMORY

CROSS-REFERENCE TO RELATED APPLICATION

This application claims the benefit of priority from U.S. Provisional Patent Application Ser. No. 62/809,644, filed on Feb. 24, 2019, and entitled "PREVENTING READ DISTURBANCE ACCUMULATION IN STT-MRAM CACHES," which is incorporated herein by reference in its entirety.

TECHNICAL FIELD

The present disclosure generally relates to storage systems, and particularly, to cache memories.

BACKGROUND

Static random access memories (SRAMs) have been a prevalent memory technology in on-chip caches. SRAMs, however, face several challenges, e.g., a high leakage power and cell instability, by technology downscaling. Recent developments in non-volatile memory (NVM) technology have made spin-transfer torque magnetic RAMs (STT-MRAMs) an alternative for SRAMs in on-chip caches. A near-zero leakage power, immunity to radiation-induced errors, higher density, better scalability, and non-volatility are some advantages of STT-MRAM caches. However, STT-MRAM caches may be error-prone in read operations. When a read current is applied to cache cells during a read operation, it is probable that contents of the cells flip unintentionally. This error, known as read disturbance, is originated from a stochastic switching behavior of STT-MRAM cells.

Error correcting codes (ECCs) may be utilized to protect on-chip caches against the read disturbance error. However, when a number of erroneous bits in a block is larger than the ECC correction capability, i.e., read disturbance accumulation occurs, ECC error correction may fail. There is, therefore, a need for an error correction method and circuit that may prevent read disturbance accumulation in cache memories.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary method for preventing read disturbance accumulation in a cache memory. An exemplary method may include accessing a plurality of data lines in a cache set, generating a plurality of corrected data from a plurality of initial data based on a plurality of error correcting codes (ECCs) utilizing an ECC decoding unit, and selecting a requested corrected data of the plurality of corrected data based on a requested way of a plurality of ways. In an exemplary embodiment, each of the plurality of data lines may include a respective data field of a plurality of data fields and a respective ECC field of a plurality of ECC fields. An exemplary plurality of initial data may be stored in the plurality of data fields and an exemplary plurality of ECCs may be stored in the plurality of ECC fields. In an exemplary embodiment, each of the plurality of ways may be associated with a respective data line of the plurality of data lines.

In an exemplary embodiment, accessing the plurality of data lines may include accessing each of the plurality of data lines by accessing a storage element of a spin-transfer torque magnetic random-access memory (STT-MRAM) cell via an access element of the STT-MRAM cell. An exemplary access element may be coupled to the storage element.

In an exemplary embodiment, generating the plurality of corrected data may include generating each of the plurality of corrected data from a respective initial data of the plurality of initial data based on a respective ECC of the plurality of ECCs. In an exemplary embodiment, the respective initial data may be stored in a respective data field of the plurality of data fields and the respective ECC may be stored in a respective ECC field of the plurality of ECC fields.

In an exemplary embodiment, generating each of the plurality of corrected data may include correcting each of the plurality of initial data by connecting each respective ECC decoder of a plurality of ECC decoders to a respective data line of the plurality of data lines.

In an exemplary embodiment, generating each of the plurality of corrected data may include sequentially correcting each of the plurality of initial data by sequentially coupling each of the plurality of data lines to an ECC decoder via an ECC multiplexer by sequentially routing each of the plurality of initial data to an input of the ECC decoder utilizing a selector input of the ECC multiplexer.

In an exemplary embodiment, selecting the requested corrected data may include obtaining the requested way by comparing each of a plurality of tags with an input tag of the plurality of tags and multiplexing the requested corrected data to an output of a data multiplexer. In an exemplary embodiment, the plurality of tags may be associated with the plurality of ways and the input tag may be associated with the requested way.

In an exemplary embodiment, multiplexing the requested corrected data to the output of the data multiplexer may include loading each of the plurality of corrected data to a respective input of the data multiplexer and loading the requested way to a selector input of the data multiplexer. In an exemplary embodiment, the requested way may be associated with the requested corrected data.

In an exemplary embodiment, obtaining the requested way may include generating a plurality of comparator outputs by coupling the plurality of tags to a comparator unit and generating a selector output by coupling the plurality of comparator outputs to a selector unit. An exemplary selector output may be associated with the requested way.

In an exemplary embodiment, generating the plurality of comparator outputs may include generating each of the plurality of comparator outputs by loading each respective tag of the plurality of tags to a respective first input of a respective comparator circuit of a plurality of comparator circuits and loading the input tag to a second input of each of the plurality of comparator circuits. In an exemplary embodiment, generating the plurality of comparator outputs may include generating each of the plurality of comparator outputs by sequentially loading each of the plurality of tags to a first input of a comparator circuit via a tag multiplexer utilizing a selector input of the tag multiplexer and loading the input tag to a second input of the comparator circuit. In an exemplary embodiment, generating the selector output may include generating an encoded data by encoding the plurality of comparator outputs utilizing an encoder. An exemplary encoded data may be associated with the requested way.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1A:
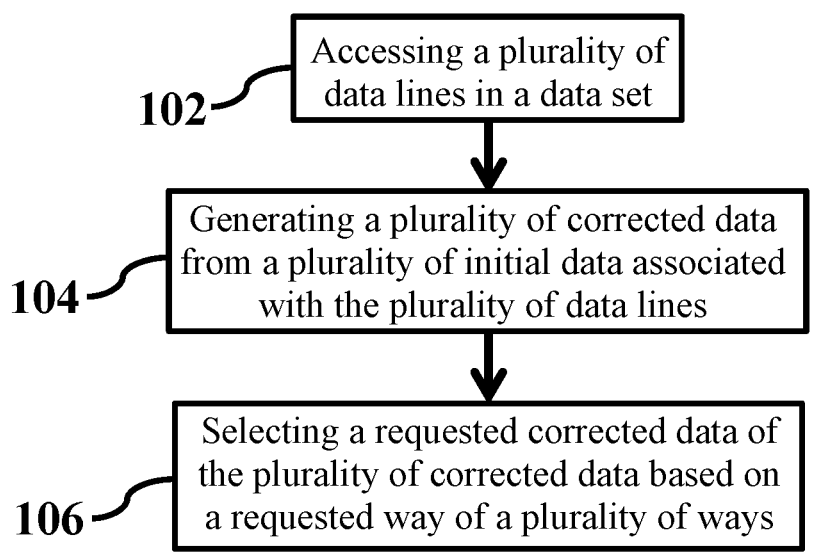
FIG. 1A shows a flowchart of a method for preventing read disturbance accumulation in a k-way set associative cache memory, consistent with one or more exemplary embodiments of the present disclosure.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein is disclosed an exemplary method and circuit for preventing read disturbance accumulation in a cache memory. An exemplary k-way set associative cache memory may include a cache set that may include k data lines (for example, 8 data lines) and k ways (for example, 8 ways) for accessing each of the data lines in the cache set. An exemplary way may provide a physical path to a corresponding data line to perform a read or write data operation on that data line. Each time a read request is received by an exemplary cache memory to access a requested data line, a number of data lines may be accessed and their contents may be read. Simultaneously, the k ways may be searched to find a way that may correspond to the requested data line. The content of the requested data line may then be loaded to an output of the cache memory. As a result, upon each read request, k data lines may be accessed but only one of them may be sent out. Therefore, a read disturbance error may occur at each of the data lines each time a read request is received by the cache memory.

To prevent read disturbance accumulation in the cache memory, an exemplary method may utilize an error correcting code (ECC) of data lines to check and correct data stored in the data lines each time a read request is received. An exemplary ECC may include an encoded form of the data that may be obtained using different coding techniques. Examples of ECCs include block codes (such as Hamming codes and Hadamard codes), convolutional codes (such as Viterbi-decoded codes), etc. As a result, probable read disturbance errors that may occur upon each access to each of the data lines may be corrected and therefore, read disturbance accumulation in the cache memory may be minimized. An exemplary method may utilize one or more ECC decoders for ECC correction of the data lines. An exemplary ECC decoder may refer to a hardware unit that may decode an ECC stored in an exemplary data line to check and correct data of the exemplary data line by implementing an error correction algorithm based on a type of the ECC. Different algorithms may be used by an ECC decoders for error correction. For example, Viterbi algorithm may be implemented by an exemplary ECC decoder if a corresponding ECC includes a Viterbi-decoded ECC.

FIG. 1A shows a flowchart of a method for preventing read disturbance accumulation in a k-way set associative cache memory, consistent with one or more exemplary embodiments of the present disclosure. An exemplary method 100 may include accessing a plurality of data lines in a cache set (step 102), generating a plurality of corrected data from a plurality of initial data associated with the plurality of data lines based on a plurality of error correcting codes (ECCs) utilizing an ECC decoding unit (step 104), and selecting a requested corrected data of the plurality of corrected data based on a requested way of a plurality of ways (step 106). In an exemplary embodiment, each of the plurality of ways may provide a path for accessing data stored in a respective data line of the plurality of data lines.

Figure 2:
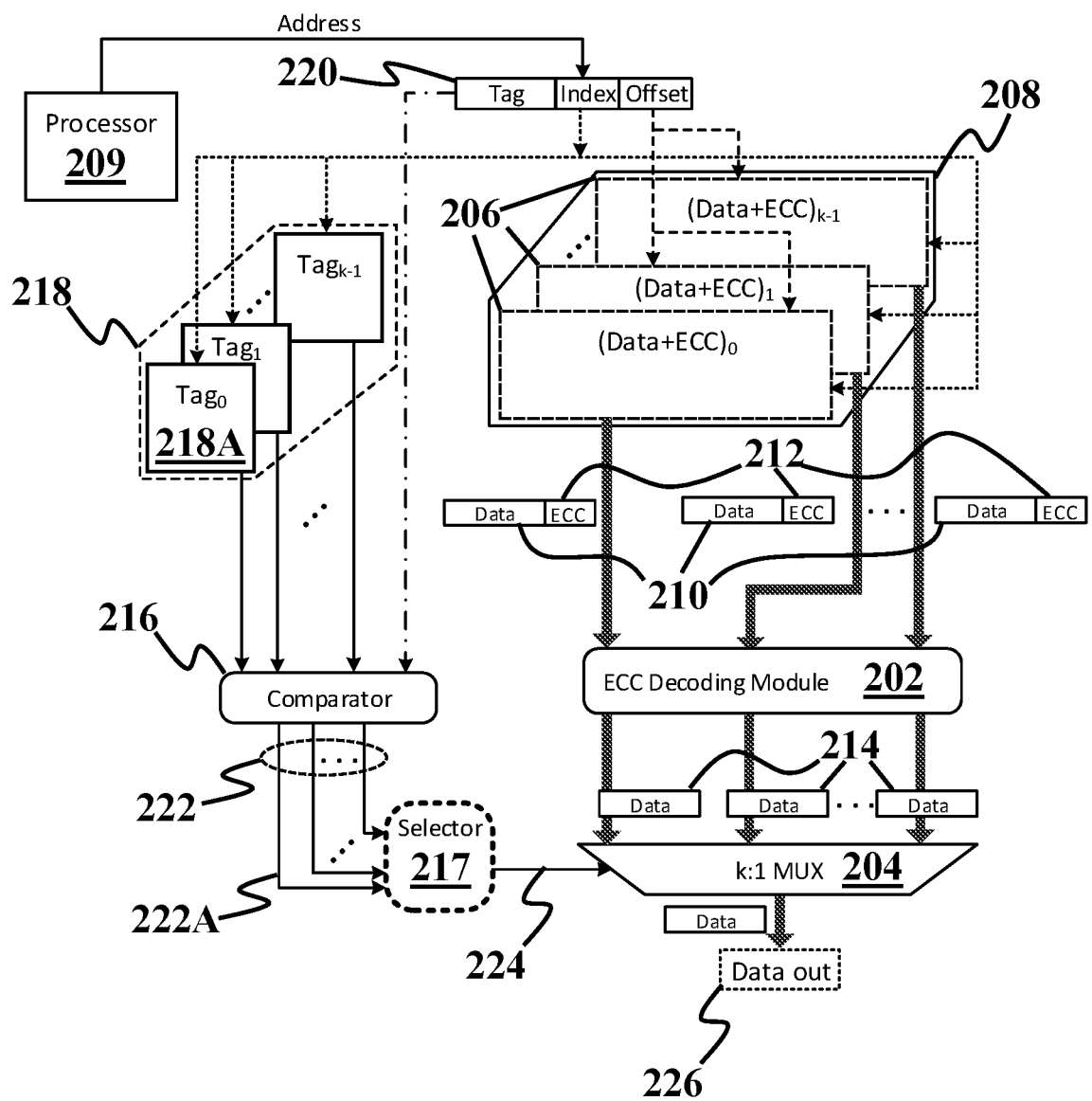
FIG. 2 shows a circuit for preventing read disturbance accumulation in a k-way set associative cache memory, consistent with one or more exemplary embodiments of the present disclosure.

For further detail with regards to method 100, FIG. 2 shows a circuit for preventing read disturbance accumulation in a k-way set associative cache memory, consistent with one or more exemplary embodiments of the present disclosure. In an exemplary embodiment, different steps of method 100 may be implemented utilizing an exemplary circuit 200. In an exemplary embodiment, circuit 200 may include an ECC decoding unit 202 and a data multiplexer 204. In an exemplary embodiment, circuit 200 may be configured for error correction of a k-way set associative cache memory. In an exemplary embodiment, a k-way set associative cache memory may be referred to a cache memory that may include k number of ways to a cache set that may include k number of data lines. Each exemplary way may have access to a respective exemplary data line.

In further detail with respect to step 102, in an exemplary embodiment, ECC decoding unit 202 may be configured to access a plurality of data lines 206 in a cache set 208. An exemplary processor 209 may allow for locating cache set 208 by extracting an index of an address of cache set 208 from the cache set 208 address. In an exemplary embodiment, each of plurality of data lines 206 may include a respective data field of a plurality of data fields and a respective ECC field of a plurality of ECC fields. An exemplary plurality of initial data 210 may be stored in the plurality of data fields and an exemplary plurality of ECCs 212 may be stored in the plurality of ECC fields. In an exemplary embodiment, after accessing each of plurality of initial data 210 for a read/write operation, a respective ECC of plurality of ECCs 212 may be utilized by ECC decoding unit 202 to check and correct a respective initial data that may have been accessed.

Figure 3:
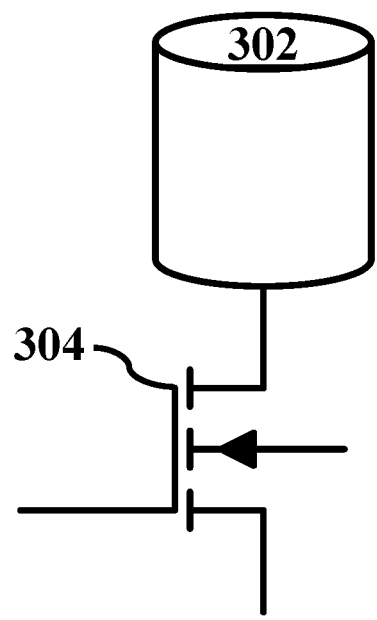
FIG. 3 shows a schematic of a spin-transfer torque magnetic random-access memory (STT-MRAM) cell, consistent with one or more exemplary embodiments of the present disclosure.

FIG. 3 shows a schematic of a spin-transfer torque magnetic random-access memory (STT-MRAM) cell, consistent with one or more exemplary embodiments of the present disclosure. An exemplary data line of plurality of data lines 206 may include an STT-MRAM cell 300. In an exemplary embodiment, STT-MRAM cell 300 may include a storage element 302 and an access element 304. In an exemplary embodiment, access element 304 may be coupled to storage element 302. In an exemplary embodiment, accessing the plurality of data lines may include accessing a respective data line of plurality of data lines 206 by accessing storage element 302 via access element 304. In an exemplary embodiment, access element 304 may include an NMOS transistor used to connect and disconnect STT-MRAM cell 300 to cache set 208. In an exemplary embodiment, storage element 302 may include a magnetic tunnel junction (MTJ) that may utilize magnetic charge to store data. An exemplary MTJ may include three layers including two ferromagnetic layers and a thin oxide barrier layer which may separate the two ferromagnetic layers. To read a data from STT-MRAM cell 300, an exemplary current may through STT-MRAM cell 300 to measure the MTJ resistance. An exemplary read operation may be a unidirectional operation and may be in a same direction as writing either '1' or '0' in STT-MRAM cell 300. Therefore, during a read operation, the content of STT-MRAM cell 300 may be probable to unintentionally switch from '1' to '0'. Therefore, in an exemplary embodiment, correcting the content of STT-MRAM cell 300 utilizing ECC decoding unit 202 after a read operation may correct probable data flip in STT-MRAM cell 300.

For further detail regarding step 104, in an exemplary embodiment, generating a plurality of corrected data 214 may include generating each of plurality of corrected data 214 from a respective initial data of plurality of initial data 210 based on a respective ECC of plurality of ECCs 212, as explained below. In an exemplary embodiment, the respective initial data may be stored in a respective data field of the plurality of data fields and the respective ECC may be stored in a respective ECC field of the plurality of ECC fields.

Figure 4A:
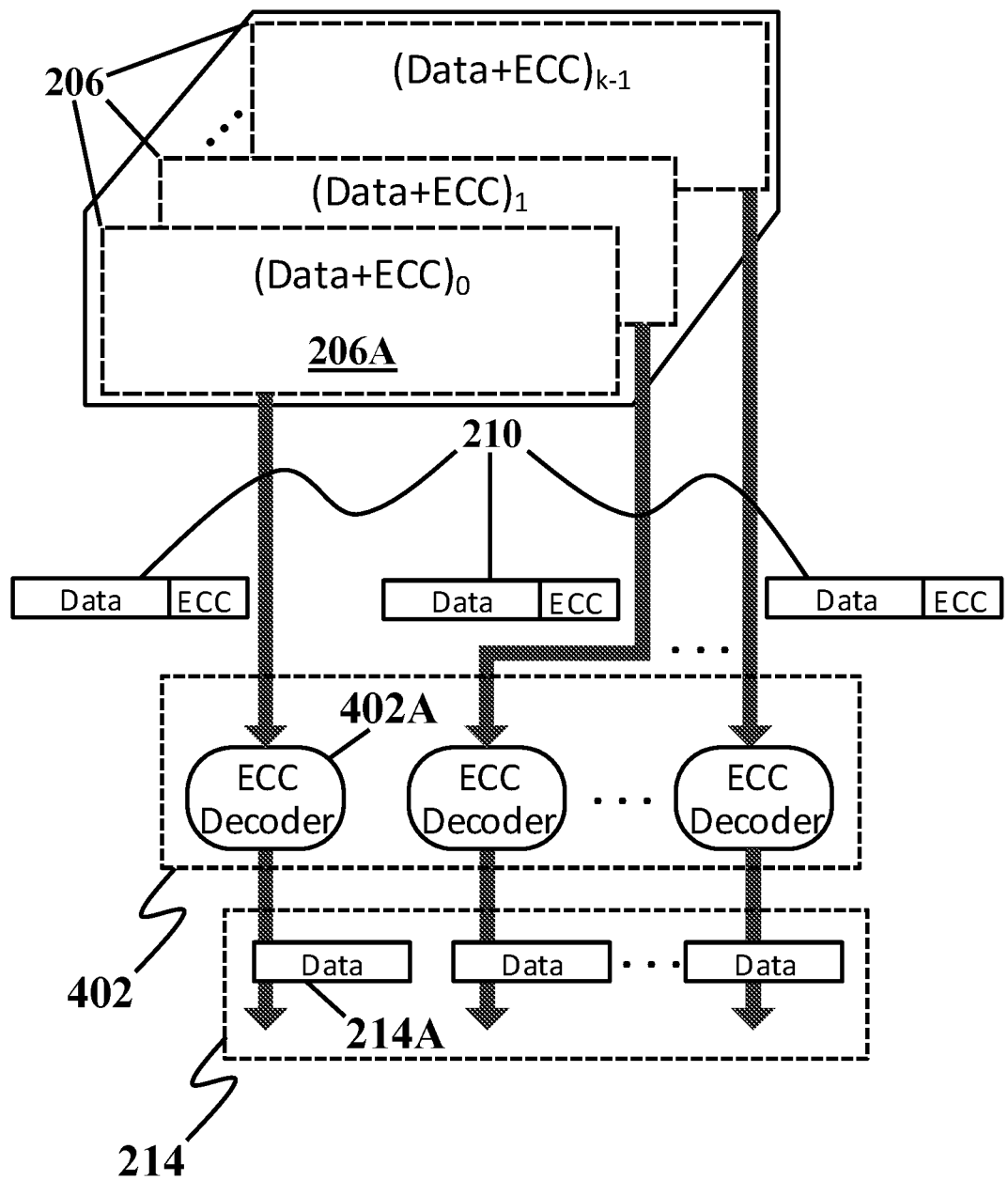
FIG. 4A shows a decoding unit including a plurality of error correcting code (ECC) decoders, consistent with one or more exemplary embodiments of the present disclosure.

FIG. 4A shows a decoding unit including a plurality of ECC decoders, consistent with one or more exemplary embodiments of the present disclosure. An exemplary decoding unit 202A may include a first implementation of ECC decoding unit 202. In an exemplary embodiment, decoding unit 202A may include a plurality of ECC decoders 402. In an exemplary embodiment, generating each of plurality of corrected data 214 in step 104 may include correcting each of plurality of initial data 210 by coupling each respective ECC decoder of a plurality of ECC plurality of ECC decoders 402 to a respective data line of plurality of data lines 206. For example, an ECC decoder 402A may be connected to a data line 206A to receive initial data and an ECC stored in data line 206A. In an exemplary embodiment, ECC decoder 402A may then generate corrected data 214A by performing correction on the received data based on the received ECC. As a result, in an exemplary embodiment, all of plurality of initial data 210 may be simultaneously checked and corrected, resulting in a time-efficient correction process.

Figure 4B:
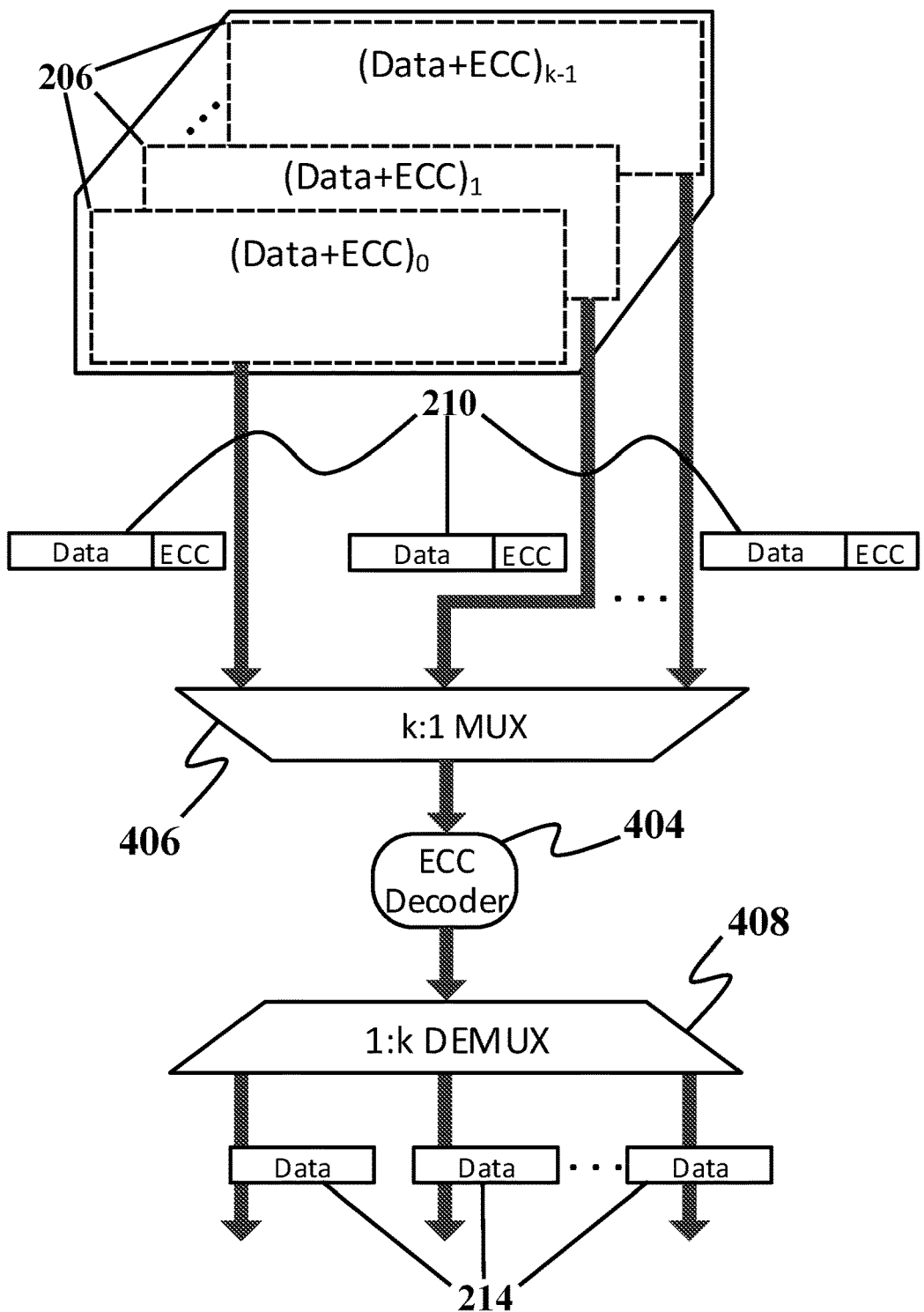
FIG. 4B shows a decoding unit including an ECC decoder and an ECC multiplexer, consistent with one or more exemplary embodiments of the present disclosure.

FIG. 4B shows a decoding unit including an ECC decoder and an ECC multiplexer, consistent with one or more exemplary embodiments of the present disclosure. An exemplary decoding unit 202B may include a second implementation of ECC decoding unit 202. In an exemplary embodiment, generating each of plurality of corrected data 214 in step 104 may include sequentially correcting each of plurality of initial data 210 by sequentially coupling each of plurality of data lines 206 to an ECC decoder 404 via an ECC multiplexer 406. In an exemplary embodiment, a selector input of ECC multiplexer 406 may be sequentially incremented (or decremented) from an initial value. At each exemplary value of the selector input, a different data line of plurality of data lines 206 may be routed to an output of ECC multiplexer 406.

In an exemplary embodiment, ECC decoder 404 may be coupled to an ECC demultiplexer 408. In an exemplary embodiment, ECC demultiplexer 408 may allow for generating each of plurality of corrected data 214 by sequentially routing the ECC decoder 404 output to each respective output of ECC demultiplexer 408. In an exemplary embodiment, each respective output of ECC demultiplexer 408 may correspond to a respective initial data of plurality of initial data 210. In an exemplary embodiment, a selector input of ECC demultiplexer 408 may be sequentially incremented (or decremented) from an initial value. At each exemplary value of the selector input, an output of ECC decoder 404 may be routed to a different output of ECC demultiplexer 408. In an exemplary embodiment, the selector inputs of ECC multiplexer 406 and ECC demultiplexer 408 may be changed simultaneously to accurately route each of plurality of data lines 206 to a respective output of ECC demultiplexer 408. In an exemplary embodiments, the selector inputs may be varied until all plurality of corrected data 214 are obtained at outputs of ECC demultiplexer 408. As a result, in an exemplary embodiment, all of plurality of initial data 210 may be corrected utilizing a single ECC decoder, leading to a reduction of implementation cost.

Figure 1B:
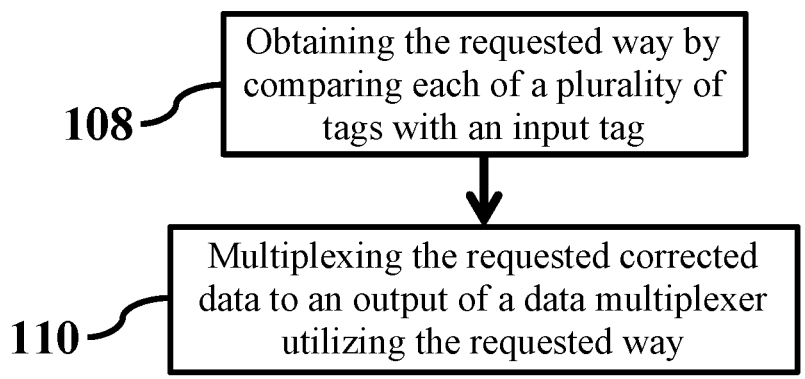
FIG. 1B shows a flowchart for selecting a requested corrected data, consistent with one or more exemplary embodiments of the present disclosure.

In further detail with respect to step 106, FIG. 1B shows a flowchart for selecting a requested corrected data, consistent with one or more exemplary embodiments of the present disclosure. An exemplary requested corrected data may include a corrected data that may be generated by correcting a respective requested initial data. An exemplary requested initial data may include an initial data that may be requested by processor 209. In an exemplary embodiment, selecting the requested corrected data may include obtaining the requested way by comparing each of a plurality of tags with an input tag of the plurality of tags (step 108) and multiplexing the requested corrected data to an output of a data multiplexer utilizing the requested way (step 110).

An exemplary input tag may be generated by processor 209 to locate the requested initial data. In an exemplary embodiment, each initial data may be distinguished by tagging a respective data line (in which the initial data may be stored) and a respective way (that may provide a path to the data line) with a respective tag of the plurality of tags. An exemplary tag may include a digital number. Therefore, in an exemplary embodiment, the requested initial data may be located by locating the input tag among the plurality of tags. To do so, in an exemplary embodiment, the input tag may be compared with each of the plurality of tags. In an exemplary embodiment, any of the plurality of tags that may be similar to the input tag (i.e., values of the two compared tags may be substantially equal) may determine the location of the input tag and therefore, may locate the requested way. In an exemplary embodiment, the requested corrected data may be located and accessed by the requested way, as described below.

Referring again to FIG. 2, in an exemplary embodiment, circuit 200 may further include a comparator unit 216 and a selector unit 217. In an exemplary embodiment, comparator unit 216 may allow for comparing each of a plurality of tags 218 with an input tag 220 of plurality of tags 218. In an exemplary embodiment, plurality of tags 218 may be associated with the plurality of ways and input tag 220 may be associated with the requested way. In an exemplary embodiment, each tag may identify a unique way of the plurality of ways that may have access to a unique data line in cache set 208. Therefore, in an exemplary embodiment, the requested way may be identified by input tag 220, leading to access to the requested initial data by accessing a respective data line in which the requested initial data is stored.

Figure 1C:
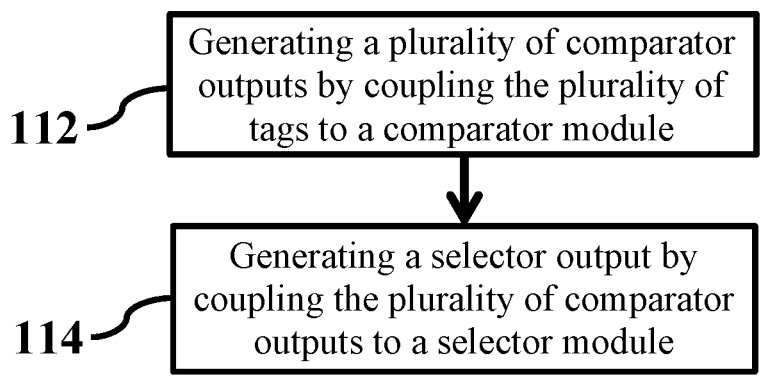
FIG. 1C shows a flowchart for obtaining a requested way, consistent with one or more exemplary embodiments of the present disclosure.

For further detail regarding step 108, FIG. 1C shows a flowchart for obtaining a requested way, consistent with one or more exemplary embodiments of the present disclosure. In an exemplary embodiment, obtaining the requested way in step 108 may include generating a plurality of comparator outputs 222 by coupling plurality of tags 218 to comparator unit 216 (step 112) and generating a selector output 224 by coupling plurality of comparator outputs 222 to selector unit 217 (step 114). In an exemplary embodiment, selector output 224 may be associated with the requested way. In an exemplary embodiment, comparator unit 216 may assign a value of each comparator output based on a comparison result. For example, if a tag is substantially equal to input tag 220, comparator unit 216 may set a respective comparator output to 1 and if the tag is different from input tag 220, the comparator output may be set to 0 (or vice versa). In an exemplary embodiment, since each of plurality of tags 218 may have a different value, only one of plurality of tags 218 may be substantially equal to input tag 220. Therefore, in an exemplary embodiment, all of plurality of comparator outputs 222 except one may be set to a same value. For example, all except one of plurality of comparator outputs 222 may be set to 0 and one of plurality of comparator outputs 222 (that may be substantially equal to input tag 220) may be set to 1, or vice versa.

Referring again to FIG. 2, in an exemplary embodiment, a location of a comparator output that has a different value than other comparator outputs may be different for different values of input tag 220. For example, if input tag 220 is equal to tag 218A, a comparator output 222A may be set to 1 and other comparator outputs may be set to 0. As a result, for each value of input tag 220, plurality of comparator outputs 222 may have a unique pattern that may distinguish input tag 220 from other tags of plurality of tags 218. In an exemplary embodiment, selector unit 217 may be configured to map each pattern of plurality of comparator outputs 222 to a respective requested way at selector output 224, leading to a path to requested data stored in a corresponding data line in cache set 208.

Figure 1D:
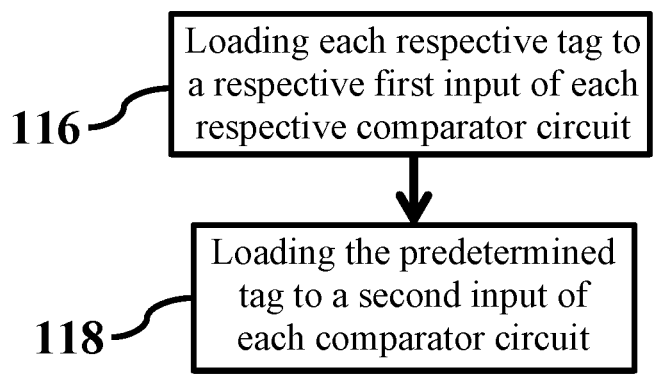
FIG. 1D shows a flowchart of a method for generating a plurality of comparator outputs utilizing a plurality of comparator circuits, consistent with one or more exemplary embodiments of the present disclosure.

In further detail with regards to step 112, FIG. 1D shows a flowchart of a method for generating a plurality of comparator outputs utilizing a plurality of comparator circuits, consistent with one or more exemplary embodiments of the present disclosure. An exemplary method 112A may include a first implementation of step 112. In an exemplary embodiment, generating plurality of comparator outputs 222 may include generating each of plurality of comparator outputs 222 by loading each respective tag of plurality of tags 218 to a respective first input of a respective comparator circuit of a plurality of comparator circuits (step 116) and loading input tag 220 to a second input of each of the plurality of comparator circuits (step 118).

Figure 5A:
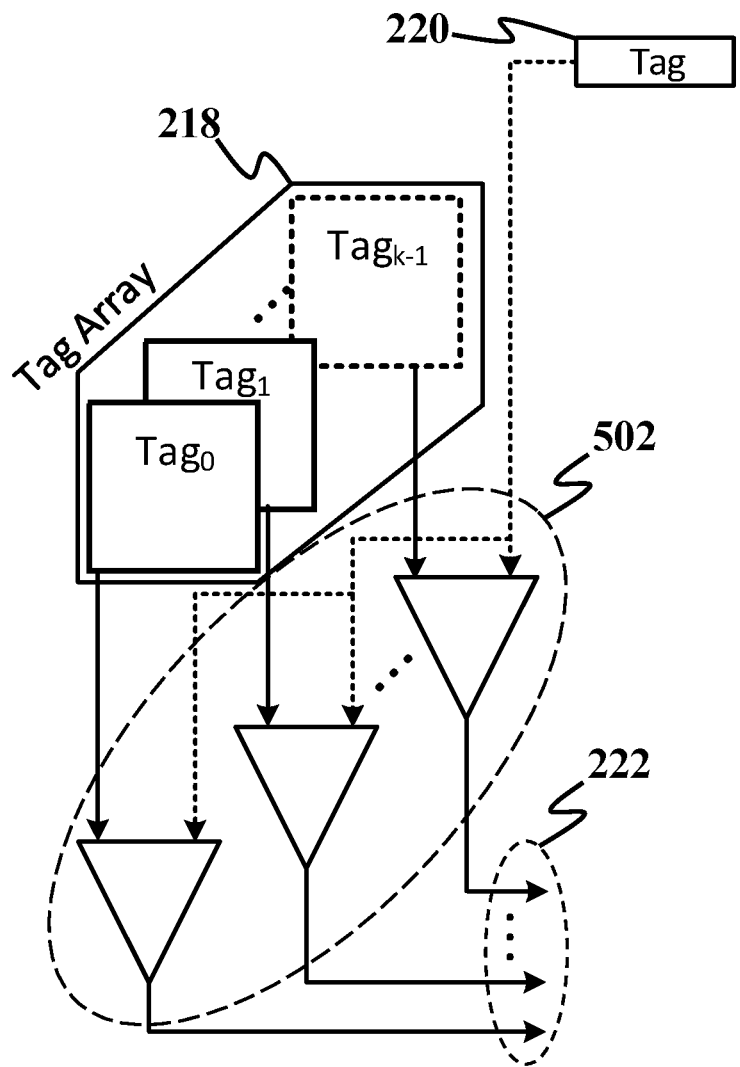
FIG. 5A shows a schematic of a comparator unit including a plurality of comparator circuits, consistent with one or more exemplary embodiments of the present disclosure.

In further detail with respect to method 112A, FIG. 5A shows a schematic of a comparator unit including a plurality of comparator circuits, consistent with one or more exemplary embodiments of the present disclosure. An exemplary comparator unit 216A may include an implementation of comparator unit 216. In an exemplary embodiment, comparator unit 216A may include a plurality of comparator circuits 502. An exemplary comparator circuit may include an analog comparator circuit (such as an operational amplifier) or a digital comparator circuit. In an exemplary embodiment, each of plurality of comparator circuits 502 may include a first input and a second input. In an exemplary embodiment, step 116 may be implemented by loading each respective tag of plurality of tags 218 into a respective first input of a respective comparator circuit of plurality of comparator circuits 502. In an exemplary embodiment, step 118 may be implemented by loading input tag 220 into the second input of each of plurality of comparator circuits 502. As a result, in an exemplary embodiment, each of plurality of comparator circuits 502 may compare a respective tag of plurality of tags 218 with input tag 220.

In an exemplary embodiment, each of plurality of comparator circuits 502 may generate a respective comparator output of plurality of comparator outputs 222. In an exemplary embodiment, utilizing plurality of comparator circuits 502 may allow for simultaneously comparing all of plurality of tags 218 with input tag 220, resulting in a time-efficient comparison. In an exemplary embodiment, since only one of plurality of tags 218 may be equal to input tag 220, plurality of comparator outputs 222 may have a unique pattern for each different location of input tag 220 in plurality of tags 218. Therefore, in an exemplary embodiment, plurality of comparator outputs 222 may be utilized to uniquely identify the requested way, as described above.

Figure 1E:
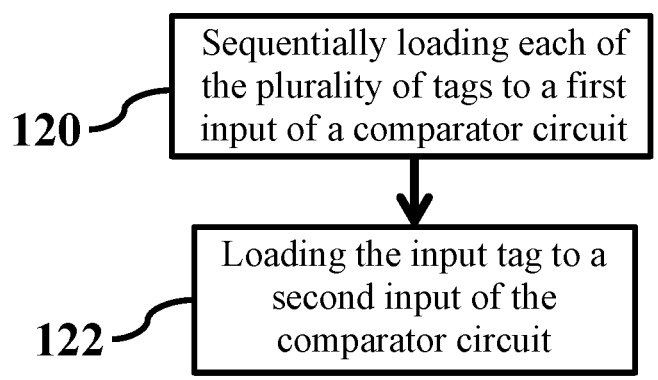
FIG. 1E shows a flowchart of a method for generating a plurality of comparator outputs utilizing a comparator circuit and a tag multiplexer, consistent with one or more exemplary embodiments of the present disclosure.

FIG. 1E shows a flowchart of a method for generating a plurality of comparator outputs utilizing a comparator circuit and a tag multiplexer, consistent with one or more exemplary embodiments of the present disclosure. An exemplary method 112B may include a second implementation of step 112. In an exemplary embodiment, generating the plurality of comparator outputs may include generating each of the plurality of comparator outputs by sequentially loading each of the plurality of tags to a first input of a comparator circuit via a tag multiplexer (step 120) and loading the input tag to a second input of the comparator circuit (step 122).

Figure 5B:
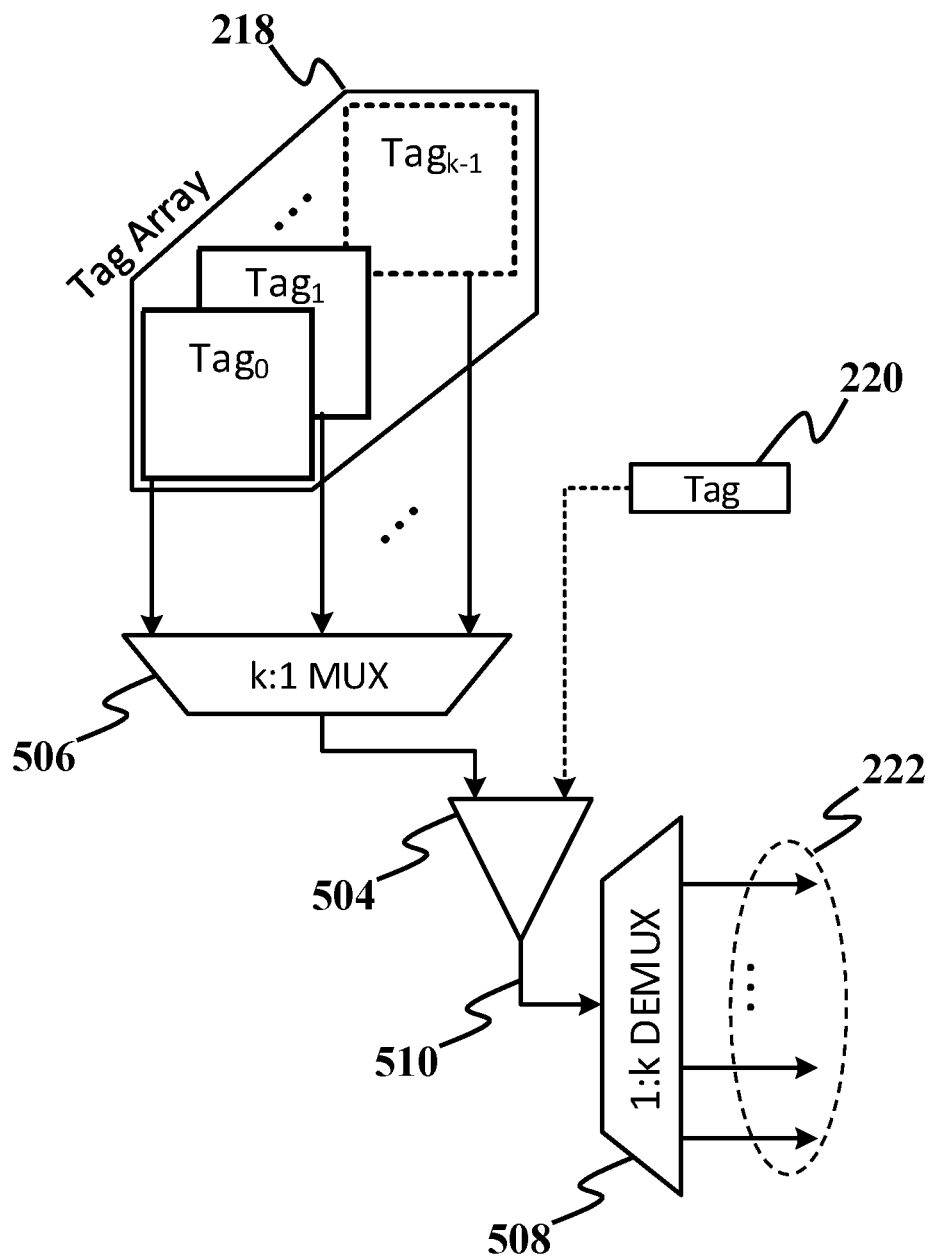
FIG. 5B shows a schematic of a comparator unit including a circuit and a tag multiplexer, consistent with one or more exemplary embodiments of the present disclosure.

In further detail with respect to method 112B, FIG. 5B shows a schematic of a comparator unit including a circuit and a tag multiplexer, consistent with one or more exemplary embodiments of the present disclosure. An exemplary comparator unit 216B may include an implementation of comparator unit 216. In an exemplary embodiment, comparator unit 216B may include a comparator circuit 504, a tag multiplexer 506, and a tag demultiplexer 508.

In an exemplary embodiment, comparator circuit 504 may include a first input and a second input. In an exemplary embodiment, step 120 may be implemented by sequentially loading each of plurality of tags 218 to the first input of comparator circuit 504 via tag multiplexer 506. In an exemplary embodiment, a selector input of tag multiplexer 506 may be sequentially incremented (or decremented) from an initial value. At each exemplary value of the selector input, a different tag of plurality of tags 218 may be routed to an output of tag multiplexer 506.

In an exemplary embodiment, step 122 may be implemented by loading input tag 220 into the second input of comparator circuit 504. In an exemplary embodiment, tag demultiplexer 508 may allow for generating plurality of comparator outputs 222 by sequentially routing an output 510 of comparator circuit 504 to each respective output of tag demultiplexer 508. In an exemplary embodiment, a selector input of tag demultiplexer 508 may be sequentially incremented (or decremented) from an initial value. At each exemplary value of the selector input, output 510 may be routed to a different output of tag demultiplexer 508. In an exemplary embodiment, the selector inputs of tag multiplexer 506 and tag demultiplexer 508 may be changed simultaneously to accurately route each of plurality of comparator outputs 222 from output 510 to a respective output of tag demultiplexer 508. In an exemplary embodiments, the selector inputs may be varied until all plurality of comparator outputs 222 are obtained at outputs of tag demultiplexer 508. As a result, in an exemplary embodiment, all of plurality of tags 218 may be compared with input tag 220 utilizing a single comparator circuit, leading to a reduction of implementation cost.

Referring again to FIGS. 1C and 2, in an exemplary embodiment, step 114 may include generating selector output 224 utilizing selector unit 217. In an exemplary embodiment, selector unit 217 may include an encoder. An exemplary encoder may allow for generating an encoded data by encoding plurality of comparator outputs 222. An exemplary encoded data may be associated with the requested way. In an exemplary embodiment, selector unit 217 may be configured to map the pattern of plurality of comparator outputs 222 to the requested way at selector output 224 utilizing the encoder, leading to a path to requested data stored in a corresponding data line in cache set 208. In an exemplary embodiment, the encoder may be configured to convert the pattern of plurality of comparator outputs 222 to a unique number that may identify the requested way.

Referring again to FIGS. 1B and 2, in an exemplary embodiment, step 110 may include multiplexing the requested corrected data to an output 226 of data multiplexer 204. In an exemplary embodiment, each of plurality of corrected data 214 may be loaded to a respective input of data multiplexer 204 by coupling each respective output of ECC decoding unit 202 to a respective input of data multiplexer 204. In an exemplary embodiment, the requested way may be loaded to a selector input of data multiplexer 204 by coupling selector output 224 to the selector input of data multiplexer 204. In an exemplary embodiment, the requested way may be utilized to route the requested corrected data to output 226. In an exemplary embodiment, since both the requested way and the requested corrected data may be identified by input tag 220, the requested corrected data may be selected from plurality of corrected data 214 according to the requested way.

Figure 6:
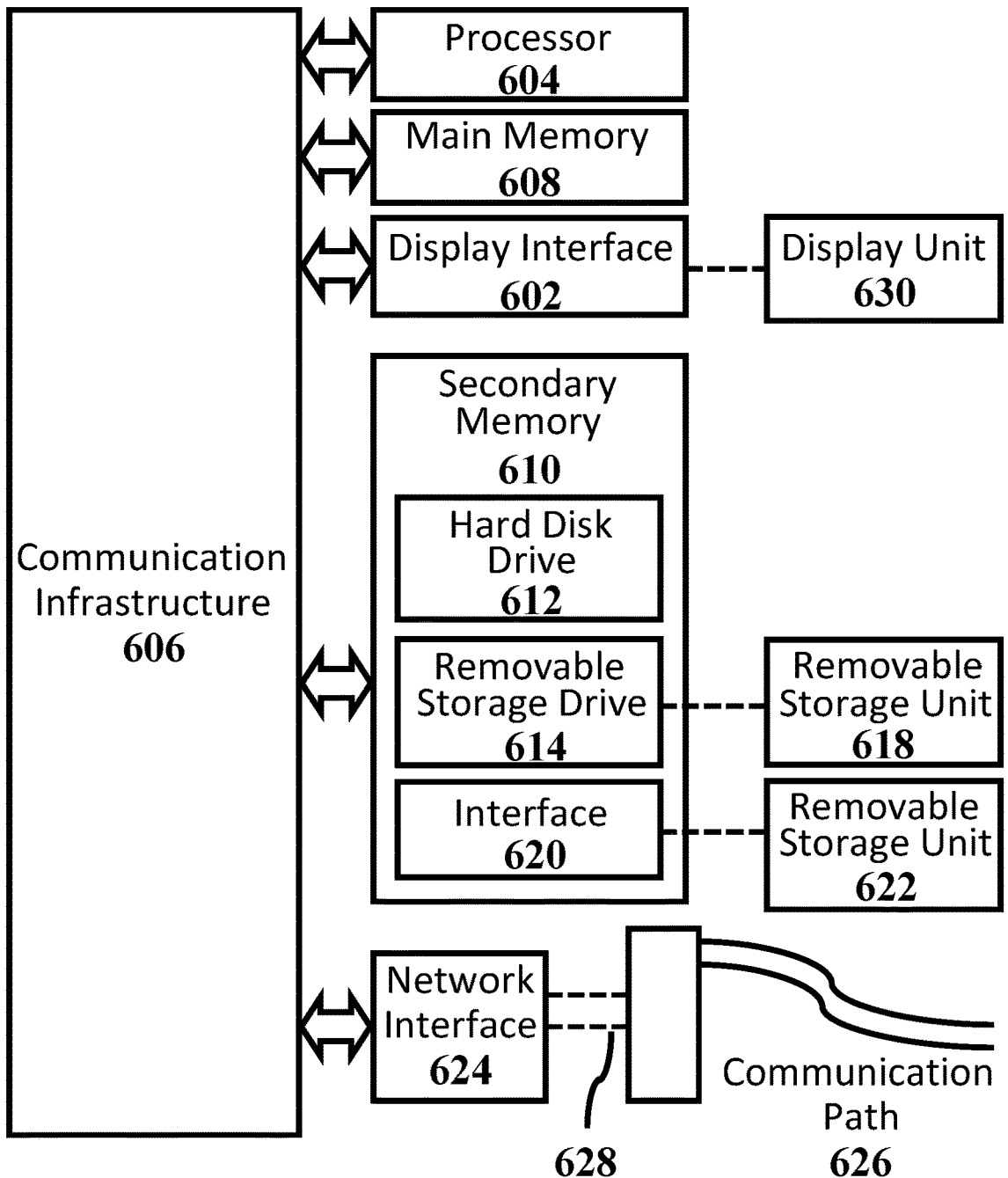
FIG. 6 shows a high-level functional block diagram of a computer system, consistent with one or more exemplary embodiments of the present disclosure.

FIG. 6 shows an example computer system 600 in which an embodiment of the present invention, or portions thereof, may be implemented as computer-readable code, consistent with exemplary embodiments of the present disclosure. For example, processor 209 may be implemented in computer system 600 using hardware, software, firmware, tangible computer readable media having instructions stored thereon, or a combination thereof and may be implemented in one or more computer systems or other processing systems. Hardware, software, or any combination of such may embody any of the units and components in FIGS. 1A-5B.

If programmable logic is used, such logic may execute on a commercially available processing platform or a special purpose device. One ordinary skill in the art may appreciate that an embodiment of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device.

For instance, a computing device having at least one processor device and a memory may be used to implement the above-described embodiments. A processor device may be a single processor, a plurality of processors, or combinations thereof. Processor devices may have one or more processor "cores."

An embodiment of the invention is described in terms of this example computer system 500. After reading this description, it will become apparent to a person skilled in the relevant art how to implement the invention using other computer systems and/or computer architectures. Although operations may be described as a sequential process, some of the operations may in fact be performed in parallel, concurrently, and/or in a distributed environment, and with program code stored locally or remotely for access by single or multiprocessor machines. In addition, in some embodiments the order of operations may be rearranged without departing from the spirit of the disclosed subject matter.

Processor device 604 may be a special purpose or a general-purpose processor device. As will be appreciated by persons skilled in the relevant art, processor device 604 may also be a single processor in a multi-core/multiprocessor system, such system operating alone, or in a cluster of computing devices operating in a cluster or server farm. Processor device 604 may be connected to a communication infrastructure 606, for example, a bus, message queue, network, or multi-core message-passing scheme.

In an exemplary embodiment, computer system 600 may include a display interface 602, for example a video connector, to transfer data to a display unit 630, for example, a monitor. Computer system 600 may also include a main memory 608, for example, random access memory (RAM), and may also include a secondary memory 610. Secondary memory 610 may include, for example, a hard disk drive 612, and a removable storage drive 614. Removable storage drive 614 may include a floppy disk drive, a magnetic tape drive, an optical disk drive, a flash memory, or the like. Removable storage drive 614 may read from and/or write to a removable storage unit 618 in a well-known manner. Removable storage unit 618 may include a floppy disk, a magnetic tape, an optical disk, etc., which may be read by and written to by removable storage drive 614. As will be appreciated by persons skilled in the relevant art, removable storage unit 618 may include a computer usable storage medium having stored therein computer software and/or data.

In alternative implementations, secondary memory 610 may include other similar means for allowing computer programs or other instructions to be loaded into computer system 600. Such means may include, for example, a removable storage unit 622 and an interface 620. Examples of such means may include a program cartridge and cartridge interface (such as that found in video game devices), a removable memory chip (such as an EPROM, or PROM) and associated socket, and other removable storage units 622 and interfaces 620 which allow software and data to be transferred from removable storage unit 622 to computer system 600.

Computer system 600 may also include a communications interface 624. Communications interface 624 allows software and data to be transferred between computer system 600 and external devices. Communications interface 624 may include a modem, a network interface (such as an Ethernet card), a communications port, a PCMCIA slot and card, or the like. Software and data transferred via communications interface 624 may be in the form of signals, which may be electronic, electromagnetic, optical, or other signals capable of being received by communications interface 624. These signals may be provided to communications interface 624 via a communications path 626. Communications path 626 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 618, removable storage unit 622, and a hard disk installed in hard disk drive 612. Computer program medium and computer usable medium may also refer to memories, such as main memory 608 and secondary memory 610, which may be memory semiconductors (e.g. DRAMs, etc.).

Computer programs (also called computer control logic) are stored in main memory 508 and/or secondary memory 610. Computer programs may also be received via communications interface 624. Such computer programs, when executed, enable computer system 600 to implement different embodiments of the present disclosure as discussed herein. In particular, the computer programs, when executed, enable processor device 604 to implement the processes of the present disclosure, such as the operations in method 100 illustrated by flowchart 100 of FIG. 1A discussed above. Accordingly, such computer programs represent controllers of computer system 600. Where an exemplary embodiment of method 100 is implemented using software, the software may be stored in a computer program product and loaded into computer system 600 using removable storage drive 614, interface 620, and hard disk drive 612, or communications interface 624.

Embodiments of the present disclosure also may be directed to computer program products including software stored on any computer useable medium. Such software, when executed in one or more data processing device, causes a data processing device to operate as described herein. An embodiment of the present disclosure may employ any computer useable or readable medium. Examples of computer useable mediums include, but are not limited to, primary storage devices (e.g., any type of random access memory), secondary storage devices (e.g., hard drives, floppy disks, CD ROMs, ZIP disks, tapes, magnetic storage devices, and optical storage devices, MEMS, nano-technological storage device, etc.).

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

EXAMPLE

In this example, a performance of an implementation of method 100 for preventing read disturbance accumulation in an 8-way set-associative SST-MRAM cache is evaluated. The SPEC CPU2006 benchmark suite is used as a workload for performance evaluation.

Figure 7:
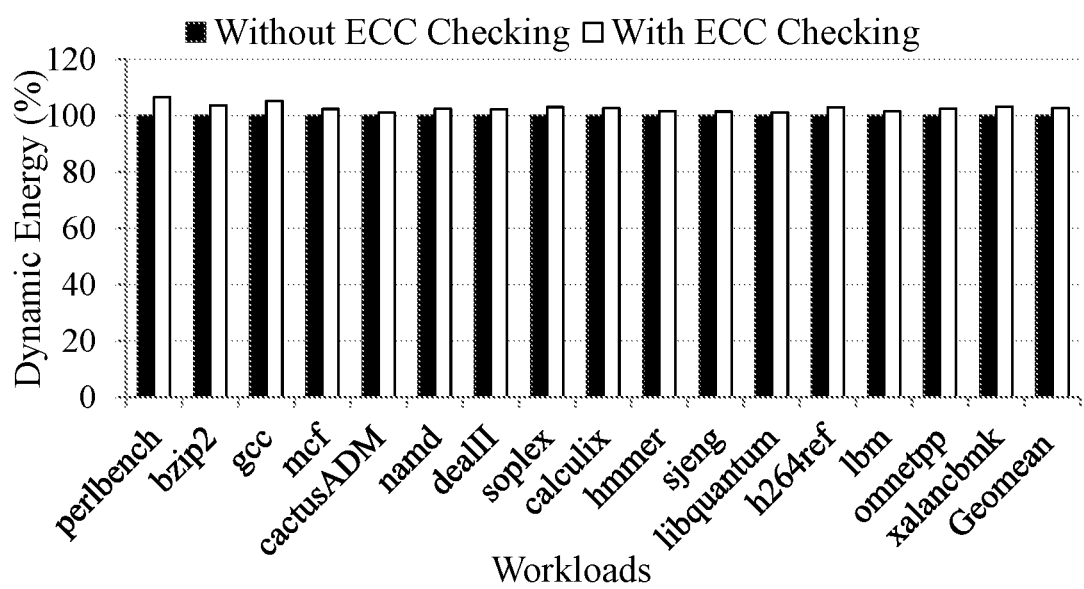
FIG. 7 shows dynamic energy consumption of a spin-transfer torque magnetic RAMs (STT-MRAMs) cache normalized to a baseline for all workloads, consistent with one or more exemplary embodiment of the present disclosure.

FIG. 7 shows dynamic energy consumption of an STT-MRAM cache normalized to a baseline for all workloads, consistent with one or more exemplary embodiment of the present disclosure. As shown in FIG. 7, an exemplary implementation of method 100 may increase the energy consumption by an average of about 2.7%. The worstcase overhead of 6.5% is observed in the cactusADM workload and in the best case, exemplary implementation of method 100 may impose about 1.0% overhead in the xalancbmk workload. Variations in energy consumption overheads may be mainly due to different contributions of read accesses in a total energy consumption. A fraction of read accesses in total cache accesses as well as a fraction of dynamic energy in a total energy consumption may varies for different workloads, which leads to a small variation in the overhead of the exemplary implementation of method 100.

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for preventing read disturbance accumulation in a cache memory, the method comprising:
    accessing a plurality of data lines in a cache set, each of the plurality of data lines comprising a respective data field of a plurality of data fields and a respective error correction code (ECC) field of a plurality of ECC fields;
    generating a plurality of corrected data from a plurality of initial data stored in the plurality of data fields based on a plurality of ECCs stored in the plurality of ECC fields utilizing an ECC decoding unit; and
    selecting a requested corrected data of the plurality of corrected data based on a requested way of a plurality of ways, each of the plurality of ways associated with a respective data line of the plurality of data lines,
    wherein selecting the requested corrected data comprises:
        obtaining the requested way by comparing each of a plurality of tags associated with the plurality of ways with an input tag of the plurality of tags, the input tag associated with the requested way; and
        multiplexing the requested corrected data to an output of a data multiplexer by:
            loading each of the plurality of corrected data to a respective input of the data multiplexer; and
            loading the requested way to a selector input of the data multiplexer, the requested way associated with the requested corrected data.

2. The method of claim 1, wherein generating the plurality of corrected data comprises generating each of the plurality of corrected data from a respective initial data of the plurality of initial data based on a respective ECC of the plurality of ECCs, the respective initial data stored in a respective data field of the plurality of data fields and the respective ECC stored in a respective ECC field of the plurality of ECC fields.

3. The method of claim 2, wherein generating each of the plurality of corrected data comprises correcting each of the plurality of initial data by connecting each respective ECC decoder of a plurality of ECC decoders to a respective data line of the plurality of data lines.

4. The method of claim 2, wherein generating each of the plurality of corrected data comprises sequentially correcting each of the plurality of initial data by sequentially coupling each of the plurality of data lines to an ECC decoder via an ECC multiplexer by sequentially routing each of the plurality of initial data to an input of the ECC decoder utilizing a selector input of the ECC multiplexer.

5. The method of 1, wherein obtaining the requested way comprises:
    generating a plurality of comparator outputs by loading each of the plurality of tags to a respective input of a comparator unit; and
    generating a selector output associated with the requested way by loading the plurality of comparator outputs to an input of a selector unit.

6. The method of claim 5, wherein generating the plurality of comparator outputs comprises generating each of the plurality of comparator outputs by:
    loading each respective tag of the plurality of tags to a respective first input of a respective comparator circuit of a plurality of comparator circuits; and loading the input tag to a second input of each of the plurality of comparator circuits.

7. The method of claim 5, wherein generating the plurality of comparator outputs comprises generating each of the plurality of comparator outputs by:
sequentially loading each of the plurality of tags to a first input of a comparator circuit via a tag multiplexer utilizing a selector input of the tag multiplexer; and
loading the input tag to a second input of the comparator circuit.

8. The method of claim 5, wherein generating the selector output comprises generating an encoded data associated with the requested way by encoding the plurality of comparator outputs utilizing an encoder.

9. The method of claim 1, wherein accessing the plurality of data lines comprises accessing each of the plurality of data lines by accessing a storage element of a spin-transfer torque magnetic random-access memory (STT-MRAM) cell via an access element of the STT-MRAM cell coupled to the storage element.

10. A cache memory, comprising:
a cache set comprising a plurality of data lines, each of the plurality of data lines comprising a respective data field of a plurality of data fields and a respective ECC field of a plurality of ECC fields;
an error correction code (ECC) decoding unit comprising a plurality of ECC decoders, an input of each respective ECC decoder of the plurality of ECC decoders connected to a respective data line of the plurality of data lines, each respective ECC decoder configured to generate a respective corrected data of a plurality of corrected data from a respective initial data of a plurality of initial data based on a respective ECC of the plurality of ECCs, the respective initial data stored in a respective data field of the plurality of data fields and the respective ECC stored in a respective ECC field of the plurality of ECC fields;
a data multiplexer configured to select a requested corrected data of the plurality of corrected data based on a requested way of a plurality of ways, each of the plurality of ways associated with a respective data line of the plurality of data lines;
a comparator unit configured to generate a plurality of comparator outputs by comparing each of a plurality of tags associated with the plurality of ways with an input tag of the plurality of tags, the input tag associated with the requested way, the comparator unit comprising a plurality of comparator circuits, each of the plurality of comparator circuits comprising:
a first input comprising a respective tag of the plurality of tags; and
a second input comprising the input tag; and
a selector unit comprising an encoder configured to generate an encoded data associated with the requested way by encoding the plurality of comparator outputs.

11. The cache memory of claim 10, wherein each of the plurality of data lines comprises a spin-transfer torque magnetic random-access memory (STT-MRAM) cell, the STT-MRAM cell comprising:
an access element coupled to a respective ECC decoder of the plurality of ECC decoders; and
a storage element coupled to the access element.

12. A circuit for preventing read disturbance accumulation in a cache memory, the circuit comprising:
an error correction code (ECC) decoding unit configured to:
access a plurality of data lines in a cache set, each of the plurality of data lines comprising a respective data field of a plurality of data fields and a respective ECC field of a plurality of ECC fields; and
generate a plurality of corrected data from a plurality of initial data stored in the plurality of data fields based on a plurality of ECCs stored in the plurality of ECC fields;
a data multiplexer configured to select a requested corrected data of the plurality of corrected data based on a requested way of a plurality of ways, each of the plurality of ways associated with a respective data line of the plurality of data lines
a comparator unit configured to generate a plurality of comparator outputs by comparing each of a plurality of tags associated with the plurality of ways with an input tag of the plurality of tags, the input tag associated with the requested way; and
a selector unit configured to generate a selector output associated with the requested way.

13. The circuit of claim 12, wherein the ECC decoding unit comprises a plurality of ECC decoders, each respective ECC decoder of the plurality of ECC decoders connected to a respective data line of the plurality of data lines, each respective ECC decoder configured to generate a respective corrected data of the plurality of corrected data from a respective initial data of the plurality of initial data based on a respective ECC of the plurality of ECCs, the respective initial data stored in a respective data field of the plurality of data fields and the respective ECC stored in a respective ECC field of the plurality of ECC fields.

14. The circuit of claim 12, wherein the ECC decoding unit comprises:
an ECC multiplexer;
an ECC decoder configured to sequentially generate each of the plurality of corrected data from each respective initial data of the plurality of initial data based on each respective ECC of the plurality of ECCs by being sequentially connected to each respective data line of the plurality of data lines via the ECC multiplexer utilizing a selector input of the ECC multiplexer, each respective initial data stored in a respective data field of the plurality of data fields and each respective ECC stored in a respective ECC field of the plurality of ECC fields; and
an ECC demultiplexer configured to sequentially route each respective corrected data of the plurality of corrected data from an output of the ECC decoder to a respective output of the ECC demultiplexer utilizing a selector input of the ECC demultiplexer.

15. The circuit of claim 12, wherein the comparator unit comprises a plurality of comparator circuits, each of the plurality of comparator circuits comprising:
a first input comprising a respective tag of the plurality of tags; and
a second input comprising the input tag.

16. The circuit of claim 12, wherein the comparator unit comprises:
a comparator circuit comprising a first input and a second input comprising the input tag;
a tag multiplexer configured to sequentially load each of the plurality of tags to the first input utilizing a selector input of the tag multiplexer; and
a tag demultiplexer configured to sequentially route an output of the comparator circuit to each respective output of the tag demultiplexer utilizing a selector input of the tag demultiplexer, each respective output of the tag demultiplexer associated with a respective tag of the plurality of tags.

17. The circuit of claim 12, wherein the selector unit comprises an encoder configured to generate an encoded data associated with the requested way by encoding the plurality of comparator outputs.

18. The circuit of claim 12, wherein the ECC decoding unit is further configured to access each of the plurality of data lines by accessing a storage element of a spin-transfer torque magnetic random-access memory (STT-MRAM) cell via an access element of the STT-MRAM cell coupled to the storage element.

* * * * *